(12) United States Patent
Suto

(10) Patent No.: US 9,778,314 B2
(45) Date of Patent: Oct. 3, 2017

(54) CAPACITIVE OPENS TESTING OF LOW PROFILE COMPONENTS

(71) Applicant: Teradyne, Inc., North Reading, MA (US)

(72) Inventor: Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 152 days.

(21) Appl. No.: 14/468,094

(22) Filed: Aug. 25, 2014

(65) Prior Publication Data

US 2016/0054385 A1 Feb. 25, 2016

(51) Int. Cl.
*G01R 31/312* (2006.01)
*G01R 31/28* (2006.01)

(52) U.S. Cl.
CPC ....... *G01R 31/312* (2013.01); *G01R 31/2812* (2013.01); *G01R 31/2808* (2013.01)

(58) Field of Classification Search
CPC ............ G01R 31/2889; G01R 31/2801; G01R 1/0416; G01R 1/06711
USPC .................................................... 324/750.25
See application file for complete search history.

(56) References Cited

U.S. PATENT DOCUMENTS

| 6,998,849 B2 * | 2/2006 | Tesdahl | G01R 31/312 324/519 |
|---|---|---|---|
| 2011/0148450 A1 * | 6/2011 | Suto | G01R 31/2808 324/756.04 |

* cited by examiner

*Primary Examiner* — Patrick Assouad
*Assistant Examiner* — Khristopher Yodichkas
(74) *Attorney, Agent, or Firm* — Wolf, Greenfield & Sacks, P.C.

(57) ABSTRACT

A probe assembly for capacitive testing electrical connections of a low profile component to a circuit assembly. The probe assembly is configured to reduce coupling of noise signals from the circuit assembly to the capacitive probe. The probe assembly includes a sensing member with a geometry that allows the probe to preferentially couple to test signals from the pins of a component under test rather than conductive structures on the circuit assembly, such as pads, and signal traces to which those pins are attached. The sensing member may be a vertical capacitive sense plate such that coupling is to an edge of the plate. The sensing member alternatively may be a horizontal capacitive sense plate with an active area of the probe surrounded by an isolation ring. Measurements made with such capacitive probes may provide test measurements that yield a reliable discrimination between a properly attached pin and an open pin.

20 Claims, 11 Drawing Sheets

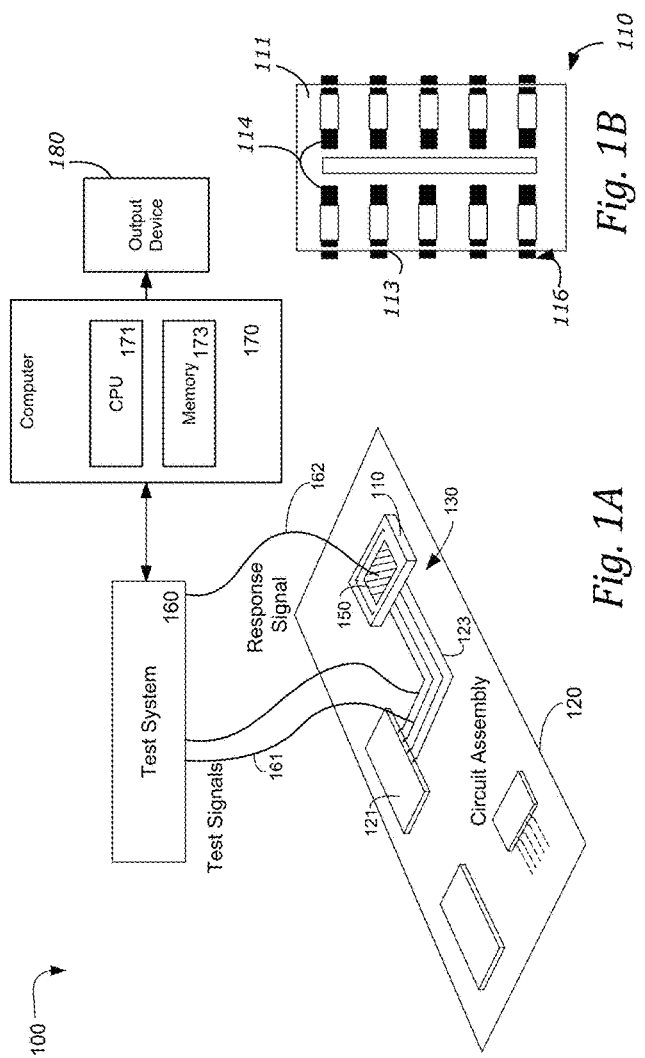

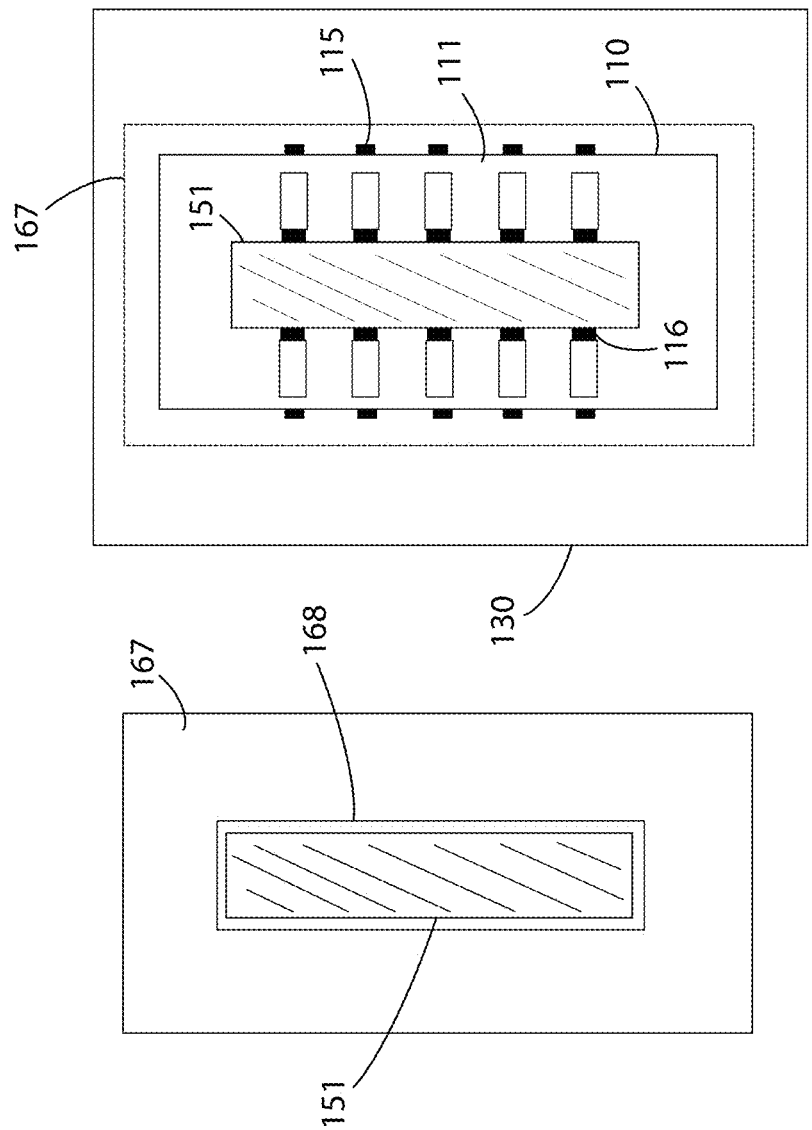

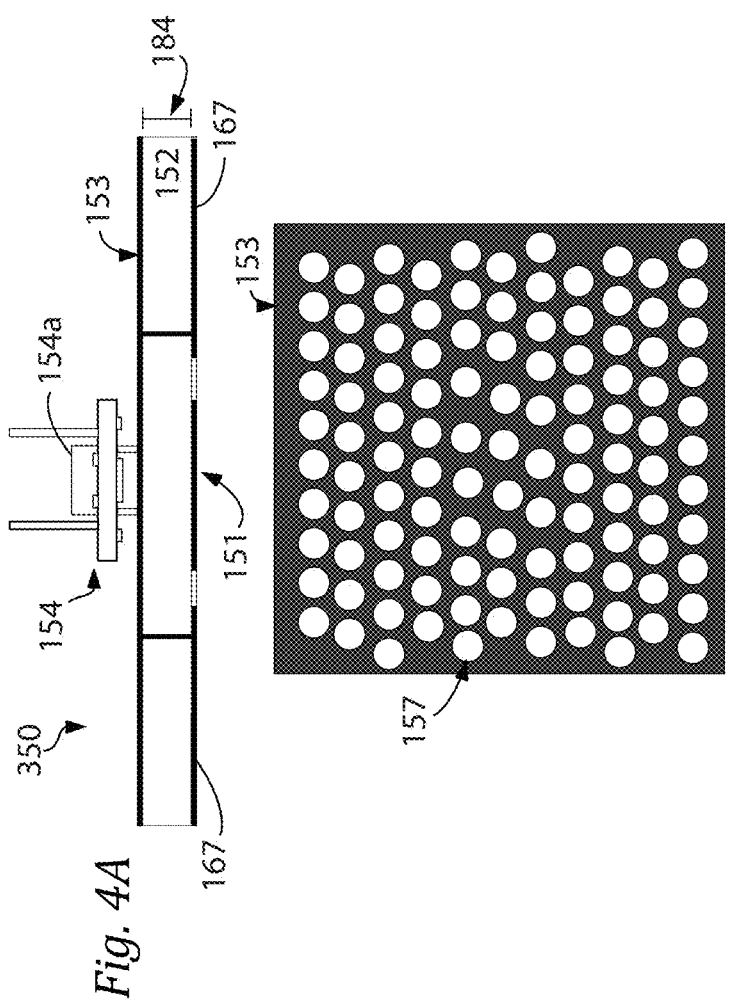

CAPACITIVE OPENS TESTING OF LOW PROFILE COMPONENTS

BACKGROUND OF INVENTION

During the manufacture of printed circuit board (PCB) assemblies, testing is performed at one or more stages to ensure that the finished product functions adequately. In some manufacturing operations, printed circuit boards are first tested before any components are mounted to them. The components may be separately tested before they are attached to printed circuit boards (PCB), usually by soldering. Once the components are attached, a further test may be performed to verify that the components are properly attached. Such testing includes "opens" tests and "shorts" tests that indicate defects in attachment of contact points of the components to the circuit assembly. These contact points, and conducting structures within the component connected to those contact points, are generally referred to as "pins," even though the contact points may take many shapes, including posts, gull wing leads or solder balls.

One approach to testing the connections to pins is called capacitive testing. In a capacitive "opens" test, a probe that includes a sense plate is pressed near or against a component with a pin to be tested. A test signal is generated at a point on the circuit assembly that should be connected to the pin under test in a properly manufactured circuit assembly. If the pin under test is properly connected to the circuit assembly, the test signal will propagate from the circuit assembly through the pin and corresponding conducting structures within the component. Though the probe plate is separated from those conducting structures, the test signal can capacitively couple to the probe plate. During a test, the signal received at the probe plate is analyzed to determine whether the test signal has been capacitively coupled to the probe plate, indicating that there is a good connection between the assembly and the pin of the component.

Though capacitive testing may be desirable, it has not been widely used for certain types of components. For example, miniature sockets and connectors have not been widely tested using capacitive test techniques. Sockets generally contain a cavity shaped to receive a semiconductor chip or other component. Each pin of the socket is formed at one end of a conductor. The other end of the conductor extends into the cavity and provides a spring contact to which other semiconductor chips can be connected. Similarly, dual-inline connectors contain two parallel rows of pins, with two corresponding parallel rows of conductors within the cavity to contact corresponding conductive members of a mating connector. While non-miniaturized components may be readily tested, when a miniature socket or connector is tested, there is little conductive structure in the component under test through which a test signal applied to a pin under test can couple to a probe plate, making capacitive testing of such components difficult.

BRIEF SUMMARY OF INVENTION

Described herein is a probe that enables capacitive testing of a low profile component, such as a connector or socket.

In accordance with some aspects, the invention relates to a method of testing a circuit assembly. The circuit assembly may comprise a substrate and a component mounted to the substrate. The component may comprise a housing and a plurality of conductors disposed within the housing. The plurality of conductors may be configured for connection to a plurality of pads on the substrate and the component may have a width in a direction parallel to the substrate. The method may comprise acts of positioning a probe adjacent to the component, wherein the probe comprises a conductive sensing member having a dimension in the direction parallel to the substrate that is smaller than the width of the component; coupling a test signal to the substrate; and sensing the signal capacitively coupled to the sensing member from the conductor of the plurality of conductors.

In another aspect, the invention may relate to a probe assembly for making capacitive measurements of test signals coupled from a conductor of a plurality of conductors of an electronic component attached to a printed circuit board, the probe assembly having a component-facing portion. The probe assembly may comprise a support member; and a planar, conductive sensing member mechanically coupled to the support member, the sensing member having a width at the component-facing side of the probe assembly that is typically less than, but not limited to 2 mm. The probe assembly may include circuitry, electrically coupled to the sensor plate, the circuitry being configured to amplify a signal capacitively coupled from a conductor of the plurality of conductors to the sensor plate.

In yet another aspect, the invention may relate to a test system for testing a component on a printed circuit board. The component may comprise a plurality of conductors disposed within a housing. The test system may comprise a fixture configured to hold a printed circuit board. Stimulus circuitry may be configured to generate a test signal and couple the test signal to a printed circuit board in the fixture. A probe assembly may have a fixture-facing side, and the probe assembly may comprise a sensing member having a width at the fixture-facing side of the probe assembly that is typically less than, but not limited to 2 mm. Measurement circuitry, electrically coupled to the sensor member, may be configured to output an indication of a signal capacitively coupled from a conductor of the plurality of conductors to the sensing member.

The foregoing is a non-limiting summary of the invention which is defined by the attached claims.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings:

FIG. 1A is a sketch of a test setup configured for capacitive testing in which embodiments of the invention may be practiced;

FIG. 1B is a top view of a component that may be tested using the inventive principles as described herein;

FIG. 3B is a bottom view of a probe assembly in accordance with some embodiments;

FIG. 3C is a schematic representation of positioning of a sensing member and a guard portion of a probe with respect to components of a socket;

FIG. 4A is a cross-section illustrating a low capacitance probe assembly according to some embodiments;

FIG. 4B is a plan view of a guard plate to provide a low capacitance probe according to some embodiments;

DETAILED DESCRIPTION OF INVENTION

Figure 2A:
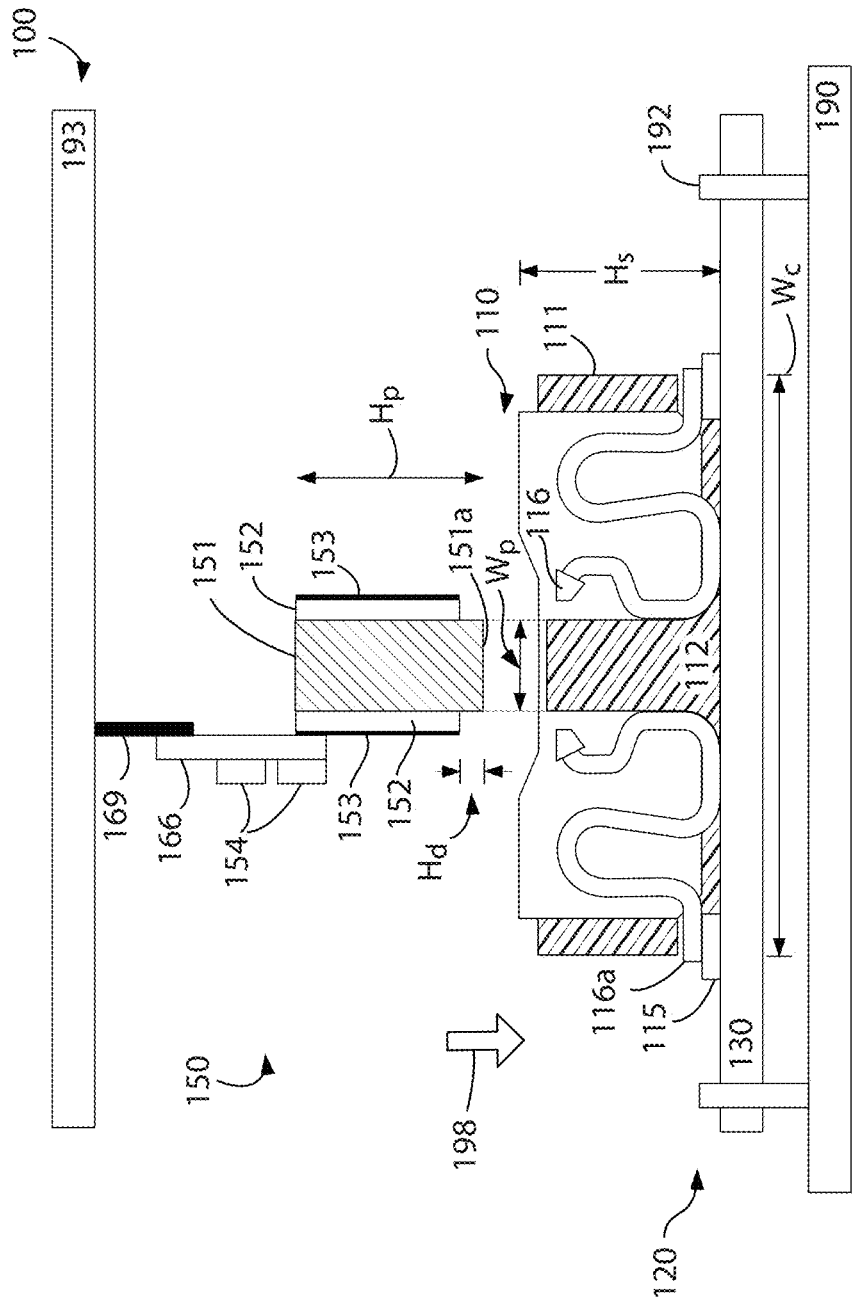
FIG. 2A is a cross-sectional view of a portion of a test setup according to a first embodiment.

The inventor has recognized and appreciated that manufacturing of circuit assemblies with miniaturized components, such as microconnectors and other low profile components, may be improved with a test probe supporting reliable capacitive opens testing of miniaturized components.

The inventor has recognized and appreciated that difficulty in capacitively testing small components with small conductive structures through which signal may be coupled to a capacitive probe is exacerbated for miniaturized sockets or microconnectors. Such miniaturized components may have a standoff from the printed circuit board of 2 mm or less. Frequently, the standoff is less than 1 mm. With standoffs of this magnitude, a capacitive probe resting on top of the component is very close to the printed circuit board. When a test signal is injected into the printed circuit board to test a connection between a pin and the board, that signal may couple to the probe, even if the pin under test is not properly connected to the printed circuit board.

Accordingly, it is difficult for a test system to distinguish, based on the amount of test signal measured, whether the pin under test is properly connected to the circuit assembly, providing a high likelihood of errors when capacitively testing pins of a socket or microconnector. The inventor has recognized and appreciated that a probe may be configured to overcome this difficulty. In contrast to a conventional capacitive test probe in which a sense plate extending fully across (or beyond) a component under test is used to maximize coupling of a test signal to the probe, a probe for testing low profile components may be shaped to support preferential coupling from only portions of the component under test. Such a probe may have a sensing member shaped to reduce unwanted coupling of a test signal injected into the circuit assembly for testing while coupling the test signal through a conductor in the component that forms a pin under test. Circuitry measuring the test signal coupled to the sensing member may have an improved ability to discriminate a properly connected pin from an open pin as part of a capacitive open test.

In some embodiments, the test probe may have a sensing member that is narrower than the component under test. In a dual-inline connector or other component in which the pins are attached to pads on a circuit assembly near the periphery of the component, a narrow sensing member may be aligned with conductors in a central portion of the component, while being separated from the pads at the periphery. Such a configuration provides a relatively higher capacitive coupling between the sensing member and the conductors carrying a signal to be measured. A relatively lower capacitive coupling is provided between the sensing member and the connector pads, PCB traces, vias and other conductors, carrying a similar signal that, if sensed, would be "noise" impacting the measurement if it were coupled to the sensing member. In this way, a relatively high signal to noise ratio may be provided, leading to more reliable testing that may reduce the cost of manufacturing the circuit assembly.

The sensing member may have any suitable shape providing the desired configuration. In some embodiments, the sensing member may be a conductive plate, mounted vertically with respect to a printed circuit board to be tested. A narrow edge of the plate may face the conductors in the component. The width of the narrower surface may be much less than the width of the component. For example, the width of the sensing member may be 2 mm or less. In some embodiments, the sensing member may have a width of 1 mm or less.

To further improve the signal to noise ratio, a vertical probe may include a guard plate on one or both surfaces to shield the sensing member from electrical noise from the circuit assembly and from other sources, including the test signal that may radiate from the printed circuit board.

In other embodiments, the sensing member may be a wire. During testing, the wire may be positioned adjacent conductors within a component that are intended to be attached to the circuit assembly. In testing a dual-inline component, for example, the wire may be centered between rows of pins on the component. The width of the wire in a direction parallel to a surface of a printed circuit board to be tested will equal the diameter of the wire, which may be less than the width of the component. Any suitable diameter way be used, and in some embodiments, the diameter of the wire may be comparable to the width of a central portion of a component under test such that the sensing member is adjacent the conductors within the component but is separated from pads at the periphery of the component.

In yet other embodiments, the test probe may have a component-facing surface that extends beyond a central portion of a component. However, only a portion of that surface may serve as an active area, and that active area may be narrower than the component. For example, the test probe may have a planar dielectric member with a surface facing the component. A conductive layer, serving as the active area, may cover a portion of the surface. The active area may be coupled to circuitry for measuring a signal capacitively coupled to the active area from conductors in the component under test.

To further improve the signal to noise ratio, the active area may be surrounded by a grounded guard ring to shield the active area from electrical noise from the circuit assembly or other sources. Additionally, the horizontal probe may also include a guard plate on a top surface to further shield the active area from noise.

It should be appreciated that a test system for performing reliable determinations of open pins may be implemented using any suitable test hardware configured for component testing. A specific example of such a test system is illustrated in FIG. 1. However, it should be appreciated that the test system of FIG. 1 is for illustration and not a limitation on the scope of the invention.

FIG. 1A illustrates a test setup 100 for testing a component 110 of a circuit assembly 120. Such a setup may be used as part of a manufacturing process for producing circuit assemblies. Circuit assembly 120 includes a substrate 130, such as a printed circuit board (PCB), and any number of devices and components such as device 121 and component 110. It should be appreciated that FIG. 1A is not drawn to scale for simplicity of illustration. Component 110, for example, may be a low profile component and may, for example, have a height of 1 mm or less. It may have a width of 4 mm or less. In some embodiments, the length may be 10 mm or more. Component 110, for example, may be a dual-inline microconnector such that a capacitive opens test on pins of component 110 performed using a conventional test probe may provide an undesirable signal to noise ratio. A microconnector, for example, may serve as a board-to-board connector. However, such a connector may serve any suitable function.

Circuit assembly 120 may be mounted in a fixture (not shown) of test setup 100 during the testing procedure. A test probe may be positioned with a sensing member adjacent component 110 for capacitive opens testing. For example, the fixture may include a fixture over-clamp (also not shown) to which probe assembly 150 is connected. The fixture over-clamp may be movable to allow circuit assembly 120 to be removed and replaced with the next circuit assembly to be tested. In some embodiments, the fixture over-clamp may have a clam shell design which allows probe assembly 150 to be lowered into an appropriate position for conducting a test and raised to replace the circuit assembly with another circuit assembly to be tested.

According to some embodiments, a test system 160 performs a capacitive opens test on a pin 113 on a component 110 by generating a test signal on a signal lead 161. The test signal is then coupled to a signal path 123 on circuit assembly 120 that, in a properly manufactured circuit assembly, is coupled to the pin under test. Signal path 123 may be any suitable type of electrical trace for propagating signals on circuit assembly 120. The test signal may include a time varying signal, which, if the pin under test is properly connected to circuit assembly 120, is propagated to the pin. For example, if the pin under test is pin 113 in component 110, the test signal will be coupled to pin 113 within component 110. During this test, other signal paths on circuit assembly 120 may be held at a constant voltage by test system 160 during the test or not driven. Though, in embodiments in which a test signal on other signal paths will not interfere with the testing of pin 113, other signal paths may simultaneously be driven with other test signals. Other possible test actions are possible, but for simplicity, are not illustrated in FIG. 1.

To test the connection of pin 113 to a substrate 130, such as a printed circuit board, of circuit assembly 120, probe assembly 150 may be positioned near component 110. The nature of the signal coupled to probe assembly 150 may indicate whether pin under test 113 is properly connected.

Probe assembly 150 includes a sensing member to which the test signal may be capacitively coupled from pin under test 113. Properties, such as the amplitude, of the test signal coupled to probe assembly 150 will depend on the quality of the connection between the signal path 123 and pin under test 113. For example, a large coupled signal may indicate the pin under test is properly connected, while a small coupled signal may suggest the signal path and the pin under test have a poor electrical connection. Accordingly, test system 160 may contain circuitry configured to compare a measured response to a threshold and indicate that a pin is properly or improperly connected based on the measured response. Though, the interpretation of the response signal may depend on the type of test being performed.

Whatever signal is coupled to probe assembly 150 may be amplified, optionally filtered and provided, via signal path 162, to test system 160. Test system 160 and computer 170 may be configured to analyze the response signal and to assess the quality of the electrical connection between the signal path and the pin under test. The response signal may be digitized by a suitable analog-to-digital converter to facilitate analysis. Test system 160 may perform signal processing of the response signal before providing the response signal to a computer 170. Computer 170 may be configured to perform further analysis of the response signal to make a determination about the electrical connection between signal path 123 and pin under test 113. Specifically, features of the response signal are analyzed by computer 170 to determine whether the connection is "good" or "bad." The particular thresholds and signal features computer 170 uses to make a determination may be identified empirically during a learn phase or in any other suitable way. During the learn phase, measurements are made on a properly assembled circuit assembly such that the characteristics of response signals when there is a good electrical connection between a signal path and a pin under test may be identified.

As illustrated, test setup 100 is configured to test an electrical connection between signal path 123 and pin under test 113 on component 110. Because the same test process may be used for each of pins 116 on component 110 and each component on circuit assembly 120, testing is described in connection with a single pin on a component for simplicity. However, it should be understood that other pins on the same component and pins associated with other components could be tested in a similar fashion, at different times, or, where signals associated with testing of one component or pin will not interfere with testing of others, at the same time. A technique known as "guarding" is one possible method to eliminate interference with the pin under test by other pins or signal traces on circuit assembly 120.

It should be appreciated that FIG. 1 illustrates one approach to generating test signals, but other approaches are possible. In the embodiment illustrated in FIG. 1A, test system 160 is connected to signal path 123 directly by signal lead 161. In some other embodiments, the test system 160 may be configured to control another device, such as device 121, to act as a virtual signal generator that generates test signals onto signal leads. Test system 160 may be configured to generate test signals on signal paths in any suitable way. Further description of methods of capacitive testing may be found, for example in "Method and apparatus for testing electrical connections on a printed circuit board" U.S. Published Patent Application US 20110204910 and "Fast open circuit detection for open power and ground pins," U.S. Pat. No. 8,760,183, both of which are herein incorporated by reference in their entirety. These patent disclosures describe techniques in which capacitive tests are performed using test signals of various formats and good or bad pins are detected based on measurements associated with multiple pins under test simultaneously, which can allow detection of faults instead of or in addition to opens. Accordingly, it should be appreciated that the techniques described herein are applicable to any form of capacitive testing of circuit assemblies.

Though any suitable components may be used to conduct capacitive tests, as shown in FIG. 1A, computer 170 has a processing unit 171 and memory 173, but this configuration is only an example. Though illustrated as separate units, test system 160 and computer 170 may be embodied as a single device or implemented in any other suitable way.

Processor 171 may be any suitable processing device such as, for example and not limitation, a central processing unit (CPU), digital signal processor (DSP), controller, addressable controller, general or special purpose microprocessor, microcontroller, addressable microprocessor, programmable processor, programmable controller, dedicated processor, dedicated controller, or any other suitable processing device.

Memory 173 may be integrated into processor 171 and/or may include "off-chip" memory that may be accessible to processor 171, for example, via a memory bus (not shown). Memory 173 may store software modules that when executed by processor 171 perform a desired function. Memory 173 may be any suitable type of computer-readable storage medium such as, for example and not limitation, RAM, a nanotechnology-based memory, one or more floppy discs, compact discs, optical discs, volatile and non-volatile memory devices, magnetic tapes, flash memories, hard disk drive, circuit configurations in Field Programmable Gate Arrays, or other semiconductor devices, or other tangible computer storage medium.

Computer 170 may be programmed to control the overall test process. For example, computer 170 may reconfigure test setup 100 to test other pins on circuit assembly 120. If computer 170 determines a test fails, additional tests may be performed to identify the cause of the failure. Computer 170 may output information about the tests to an output device 180, such as a display or printer, or may send information about defects on circuit assembly 120 to other manufacturing equipment for use in subsequent stages of manufacture.

Computer 170 may include computer executable software modules, each containing computer executable instructions. The software modules may be stored in memory 173 and executed by processor 171. However, this is just an illustrative embodiment and other storage locations and execution means are possible. In some embodiments, suitable computer executable modules are used to control test system 160 for testing of circuit assembly 120.

For testing chip sockets, connectors or other components with relatively small conductive members, such as pin 113, that provide weak capacitive coupling to a sensing member in a conventional probe assembly, one or more enhancements may be used to increase the accuracy of capacitive testing. In some embodiments, a low capacitance probe, as described in greater detail below, may be used.

Alternatively or additionally, mechanical features may be used to provide a controlled spacing between a sensing member and the conductive members. The spacing may be small enough to provide reliable capacitive coupling, yet large enough to prevent contact between the probe assembly and the conductive elements, which may be easily damaged. For example, probe assembly 150 may be configured for insertion into a cavity formed in a chip socket, connector or other similar component. Spacers may be incorporated into one or more of the probe assembly, the component or the circuit assembly substrate to allow a sensing member to be positioned close to pins of the chip socket with a greatly reduced risk of damage.

Probe assembly 150 may have spacers for properly positioning a sensing member of the probe near conductive members, which are generally referred to as "pins," of component 110. These "pins" are designed to make contact with pads on a semiconductor chip when it is inserted into component 110, but are fragile and easily damaged. The spacers may have any suitable shape and may be positioned such that probe assembly properly aligns with and is positioned adjacent to a housing of component 110 and/or a surface of the circuit assembly's substrate 130 to ensure proper alignment proximate to the pins as the probe assembly is brought closer to component 110. In some embodiments, the spacers may be adjustable such that the alignment can be modified and/or a gap between the sensing member of probe assembly 150 and the pins may be increased or decreased. For example, screws may be used to fine tune the configuration of the spacers.

Turning now to FIG. 1B, a top view of component 110 is illustrated, which may be beneficially tested as described herein. Here component 110 is a miniaturized, dual-inline socket. Such a socket has parallel rows of pins. A dual-inline socket is one type of component 110 that may be connected to circuit assembly 120 and tested using a low capacitance probe assembly. The socket shown in FIG. 1B is typically used to connect signals from circuit assembly 120 to other electronic components including but not limited to: a second printed circuit board assembly, a display device, speakers, transducers, microphones, camera units and user control switches. The socket can also allow a microchip to be seated on a circuit assembly such that the microchip may be mechanically removed. A housing 111 provides mechanical support for pins 116 and the microchip. Housing 111 may be formed in any suitable way. For example, housing 111 may have raised portions within the interior surface of component 110. When the socket is used to hold a chip, the raised portion may be used to hold the chip. During testing, with the chip removed, that raised portion may prevent a probe from contacting the conductive members in the socket.

In the embodiment illustrated, at least some of pins 116 of component 110 are intended to be connected to signal paths on circuit assembly 120 (FIG. 1A). Any suitable type or combination of types of pins may be used as part of component 110. For example, pins 116 may be male, female, hermaphroditic, zero-insertion-force (ZIF), or any other type of interface for forming an electrical connection. In some embodiments, a lever or other mechanical structure (not shown) is provided with component 110 to securely fasten and release the inserted microchip. Pins 116 may be shaped for electrical connection to the signal paths on a circuit assembly in any suitable way, for example, by soldering. In the embodiment illustrated, gull-wing tabs are used, though it should be appreciated that this form of attachment is illustrative and other forms of attachment may be used.

In the illustrated embodiment, component 110 has a region 114 centered in the middle of the component. Such a feature is common in dual-inline connectors or sockets. Region 114 may be a center region of component 110 and may include two parallel rows of pins 116 as shown. Though, component 110 may be populated by pins 116 in any suitable way.

As noted above, a spacer to provide a controlled separation and alignment between a probe assembly and the pins of a component may be incorporated into the probe, the component and/or the circuit assembly. Accordingly, component 110 may include spacers (not shown) for guiding and limiting the approach of a probe assembly into proximity with component 110. Alternatively, the spacers may limit insertion of the probe assembly into a cavity formed within component 110. The spacers may be positioned to guide the sensing member toward the component and/or restrict the probe from further encroaching on the surface of pins 116 when the sensing member of the probe is a predetermined distance from pins 116. Though not shown in FIG. 1B, a component may also be shaped to assist in laterally aligning a probe over of pins 116.

FIGS. 2A-2C, 3A and 3D illustrate in cross-section views of embodiments of a portion of test setup 100. As illustrated, circuit assembly 120 may be held in place on a fixture 190 by positioning pins 192. On circuit assembly 120, pins 116 of component 110 are connected to circuit assembly substrate 130 at connection points 115. Connection points 115 may be solder joints formed on pads or any other suitable type of connection for establishing electrical conductivity between pins 116 and the signal paths (not shown) formed on or in substrate 130. Connection points 115 may also provide mechanical support for component 110. Though, in some embodiments additional mechanical supports may also be used to further secure housing 111 directly to substrate 130. Though component 110 is illustrated as a dual-inline board-to-board connector in FIG. 1B, it should be appreciated that component 110 may be any suitable type of component that provides pins on the surface of circuit assembly 120. Component 110 may be, for example and not limitation, a socket, an LGA socket, or any other suitable type of component.

In FIGS. 2A-3E, component 110 is a dual-inline connector with component housing 111. Pins 116 are positioned in two parallel rows. Ends of the pins 116 align with contact pads positioned at the periphery of the component. Inside the component, the pins are conductive members, and those conductive members are positioned in the center of the component housing 111.

FIG. 2A shows a cross-section of the rows of pins 116. In the illustrated embodiment, the conductive portions of pins 116 with the component 110 are curved to create spring-force contacts, which will press against conductive members of a mating connector inserted in a cavity in housing 110. In the example illustrated in FIG. 2A, component 110 contains a center region 112. Center region 112 may provide support for pins 116 or for support or guidance of a mating connector inserted into component 110. In an embodiment in which component 110 is a chip socket, a center region 112 may serve as a support for a chip inserted into the socket.

Pins 116 are attached to the circuit assembly at pin terminals 116a. Each pin terminal 116a may be soldered to a pad 115 on the substrate 130. Pads 115 surround the periphery of the component 110. In the example illustrated in FIG. 2A, component 110 is raised off the substrate 130 by a distance $H_s$. Distance $H_s$ may impact the degree to which noise signals from pads 115 (or signal traces on substrate 130) couple to sense plate 115. In the embodiment illustrated, $H_s$ may be 2 mm or less. In some embodiments, $H_s$ may be 1 mm or less.

FIGS. 2A-2C, 3A and 3D also illustrate a probe assembly according to some embodiments. The probe assembly may be connected to fixture over-clamp 193. In the embodiment illustrated in FIG. 2A, probe assembly 150 comprises a conductive sensing member shaped as a plate. The plate has a component facing edge and broader surfaces that are perpendicular to board 130.

In this embodiment, probe assembly 150 includes a probe head with a sensing member formed by a sense plate 151 separated by a dielectric layers 152 from guard plates 153. Sense plate 151 and guard plates 153 may be substantially parallel with one another. Sense plate 151 and guard plates 153 may be made of any suitable highly conductive material, such as copper, gold, alloys, other metals or suitably conductive materials. Both sense plate 151 and guard plates 153 may be coupled by wires or other suitable conductors to a test system, such as test system 160 (FIG. 1A). Guard plates 153 may be grounded to aid in isolating the test environment between sense plate 151 and pins 116 from external electrical signals that could disrupt measurement of a signal coupled between pins 116 and sense plate 151. Probe assembly 150 may also include circuitry 154 for amplifying test signals coupled to the sense plate 151. However, it should be appreciated that guard plates are not essential. In other embodiments, such as if sense plate 151 exhibits a minimal amount of surface area, the guard plates 153 and dielectric 152 may not be required for shielding.

The probe assembly 150 may be connected to the fixture over-clamp 193 or any other suitable interface components. Though not illustrated in FIG. 2A, attachment to the fixture may be via a compliant mounting. In the embodiment of FIG. 2A, sense plate 151 is mounted to amplifier circuit board 166 which is mounted to fixture over-clamp 193 via top mounting post 169. Sense plate 151 may be attached to amplifier circuit board 166 in any suitable way. In the embodiment illustrated, sense plate 151 is connected to amplifier circuit board 166 at an upper corner of the guard plate 153. Attachment mechanisms are known in the art and are not shown in detail for simplicity.

When a board is being tested, probe assembly 150 may be lowered toward component 110 in direction 198 in any suitable way. Once probe assembly 150 is positioned adjacent to the pins 116 of component 110, capacitive testing of pins 116 may be performed. Probe assembly 150 may also include circuitry 154 for amplifying signals coupled to the sense plate 151. Amplified test signals may then be sent to test system 160 for further analysis. This analysis may include conventional signal processing techniques known in the art to compare a measured signal to a known signal representing a properly connected pin. If a test signal differs in value by a certain amount as compared to the known good signal, then the pin may be determined to be an open pin. Techniques described herein may lead to an improved reliability in determining an open pin. In some embodiments that use the techniques described, a ratio of the "good" signal value to a value of signal measured when the pin is an "open" pin may be as high as 4 to 1. In other embodiments, this ratio may be 2 to 1.

Such an improvement in the difference between the magnitude of a signal measured when a pin is properly connected and when it is open may be achieved through the configuration and positioning of sense plate 151 with respect to the conductive members of the component. Sense plate 151 may have a geometry that results in positioning a narrow sensing member adjacent those conductive members. This geometry, while allowing coupling of the desired signal on the conductive member, reduces coupling of unwanted signals (i.e. "noise") from the circuit assembly 120 surrounding the periphery of the component 110.

In the embodiment illustrated in FIG. 2A, sense plate 151 is a vertical capacitive sense plate. Sense plate 151 may have an edge 151a that faces pins 116. Edge 151a may have a width $W_p$ narrower than a width $W_c$ of component 110. In the embodiment illustrated, $W_p$ is comparable in width to the spacing between opposite facing pins 116. For example, $W_p$ may be 2 mm or less. In some embodiments, $W_p$ may be 1 mm or less. In other embodiments, $W_p$ may be narrower than the spacing between pads 115 on opposite edges of component 110. For example, the width may occupy less than 75% of the distance separating the pads. However, in other embodiments, the width may be 50% of the distance or less. Restricting the width $W_p$ to less than the width $W_c$ of component 110 may allow a higher percentage of a signal coupled to sense plate 151 to consist of test signals from pins 116. Restricting width $W_p$ to less than the width $W_c$ of component 110 may additionally reduce the noise signals coupling to sense plate 151 from surrounding pads 115 and other components or conductive traces of circuit assembly 120.

FIG. 2A additionally illustrates vertical sense plate 151 with a height $H_p$. In some embodiments, height $H_p$ may be less than width $W_c$ of component 110. However, any suitable height may be used.

In FIG. 2A, an additional technique to further improve the signal to noise ratio of the test signal is illustrated. In this example, a guard plate 153 is attached on both sides (or in some embodiments other numbers of sides such as one or all four sides) of sense plate 151 to shield the sense plate from electrical noise from the circuit assembly. As shown, each guard plate 153 and sense plate 151 are separated by a dielectric 152. Dielectric 152 is preferably a dielectric having low losses at least in the frequency range used for testing. Suitable dielectrics include, for example and not limitation, polytetrafluoroethylene (PTFE), polycarbonate and polyethylene, though any suitable dielectric may be used. Guard plate 153 and dielectric 152 may be attached to sense plate 151 in any suitable way that shields the sense plate from noise while allowing signal coupling from the pins 116 to the component edge. In FIG. 2A, sense plate 151 extends a distance $H_d$ beyond a bottom surface of both the guard plate 153 and the dielectric 152. The distance $H_d$ may be on the order of distance $W_P$. However, it should be appreciated that distance $H_d$ may be inversely proportional to the width $W_P$, such that for a wider edge, a smaller exposure $H_d$ may be provided.

FIG. 2A illustrates one example of a sensing member geometry that may yield a better signal to noise ratio for test setup 100. In that embodiment, the sensing member was a vertical sense plate 151. In other embodiments, the sensing member may be a wire centered between the rows of pins 116. The wire may have a diameter d that is narrower than $W_c$ of component 110. For example, diameter d may be 1 mm or less. Alternatively, the wire may have a diameter d much smaller than the width of the spacing between opposite facing pins 116. For example, diameter d may be 0.5 mm or less. In still other embodiments, the sensing member may have any suitable geometry that reduces the coupling of noise signals from the circuit assembly to the sensing member.

While probe assembly 150 has been depicted as moving straight down in direction 198 in FIG. 2A, it should be appreciated that movement to engage probe assembly 150 with circuit assembly 120 may take any suitable form. For example, probe assembly 150 may be attached to a hinged fixture over-clamp. Thus, probe assembly may move closer to component 110 in an arc or along any suitable path. It should be appreciated that probe assembly 150 need not move in an absolute sense. Rather, relative motion between the probe assembly 150 and component 110 can achieve the desired position of probe assembly 150 and component 110, even if such relative motion is achieved by motion of the circuit assembly relative to probe assembly 150.

For performing a capacitive opens test, a sensing member of the probe may be brought close to, but prevented from touching, the conductors forming the pins within component 110. In the embodiment of FIG. 2A, central portion 112 of an insulative housing of component 110 may be such that it prevents direct contact of the sensing member with the conductors 116. In such an embodiment, motion of probe assembly 150 toward conductors 116 may be arrested when the probe assembly contacts the central portion 112. Such a configuration may be suitable for a configuration when the sensing member fits within a cavity of component 110. To support positioning of the sensing member based on contact with an insulating member, the probe assembly may be mounted with a compliant structure, such as a spring or pogo pin. A spring 194 and a pogo pin 195 are shown in FIG. 3A.

Figure 2B:
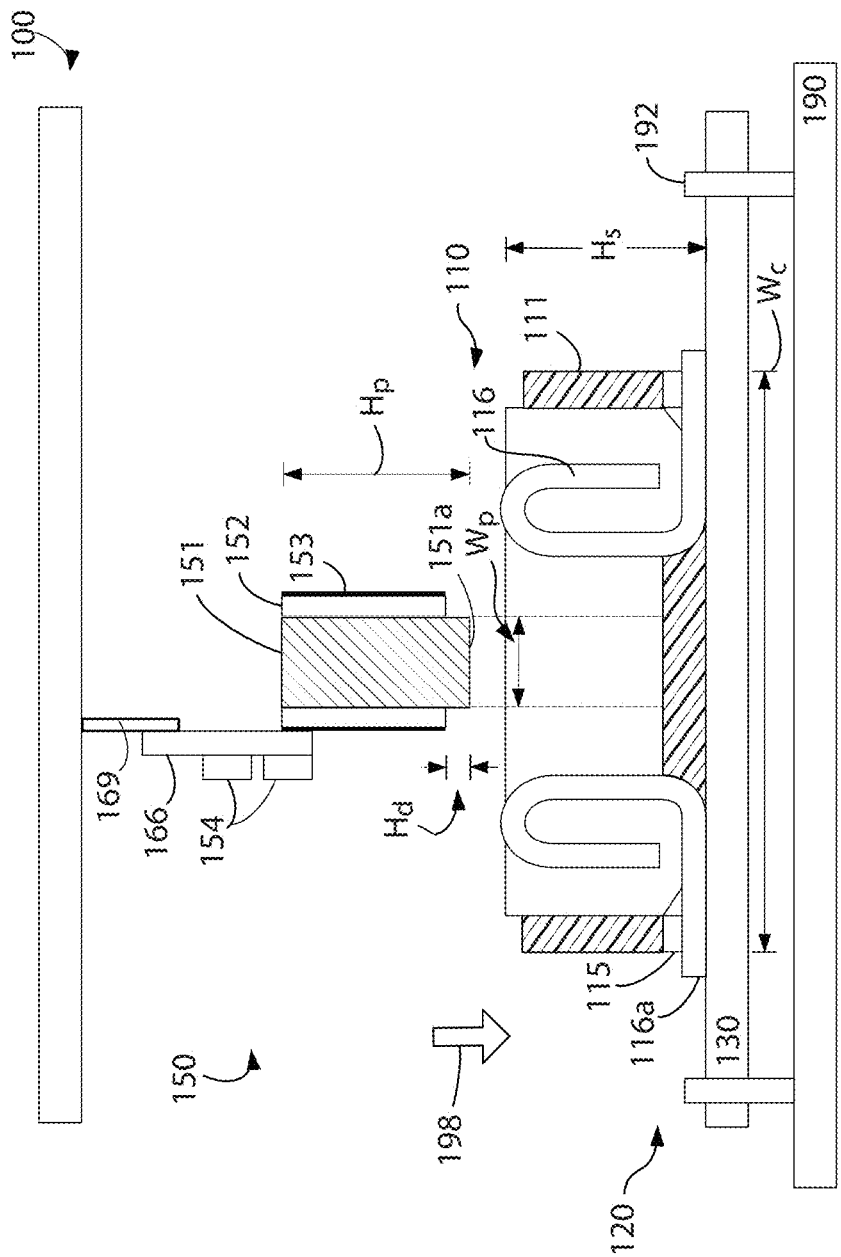
FIG. 2B is a cross-sectional view of a portion of a test setup according to a second embodiment.

Other techniques may be used to avoid contact between the sensing member and the conductors. FIG. 2B illustrates the embodiment of FIG. 2A without the center region 112. In this example, the downward motion of probe assembly 150 toward conductors 116 may be arrested when the probe assembly contacts a wall of a housing of component 110.

Alternative probe assembly configurations that provide a greater difference in measured signal of a properly connected versus an open pin is illustrated in FIGS. 3A-3D. These figures contain multiple views of a test setup 100. As described above in FIG. 2A-2B, test setup 100 in FIG. 3A includes probe assembly 350, circuit assembly 120 and component 110. The sensing member in probe assembly 350 may have any suitable geometry that results in a reduced coupling of noise signals from pads or other conductors of the circuit assembly 120 surrounding the periphery of the component 110.

Figure 3A:
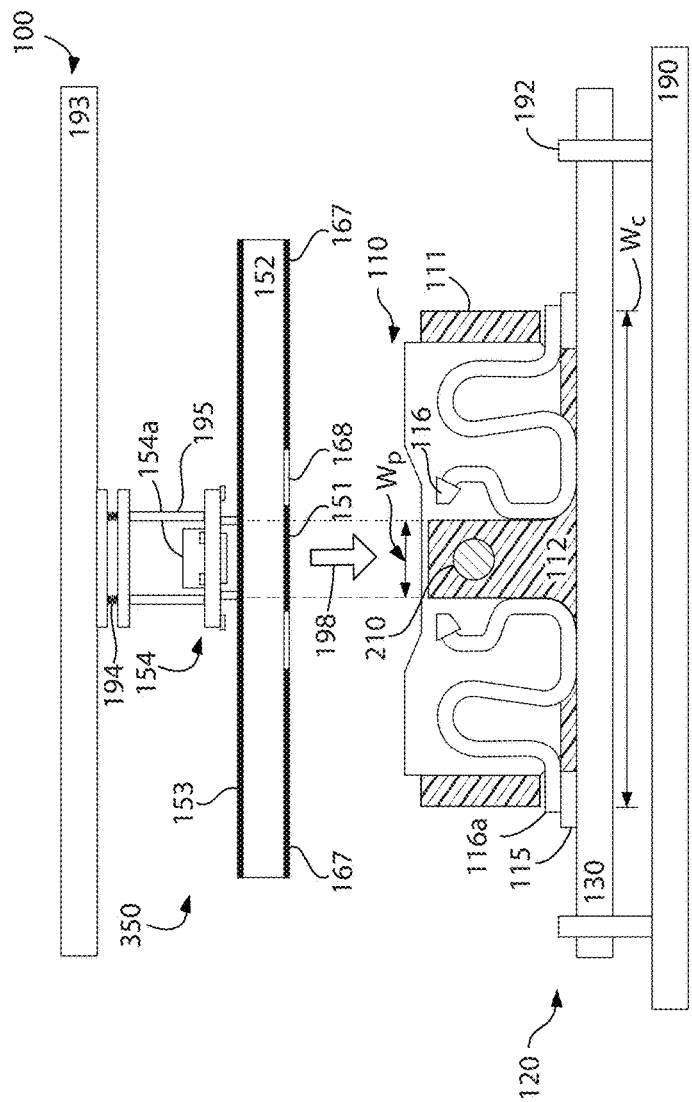
FIG. 3A is a cross-sectional view of a portion of a test setup according to an alternative embodiment.

In the embodiment illustrated in FIG. 3A, the sensing member is a horizontal capacitive sense plate 151. Sense plate 151 may have a width $W_p$ narrower than a width $W_c$ of component 110. In the embodiment illustrated, $W_p$ is comparable in width to the spacing between opposite facing pins 116. $W_p$ may be 4 mm or less. Alternatively, $W_p$ may be 3, 2 or 1 mm or less. Restricting the width $W_p$ to less than the width $W_c$ of component 110 may allow a higher percentage of a test signal coupled to sense plate 151 to consist of test signals from pins 116. Restricting width $W_p$ to less than the width $W_c$ of component 110 may additionally reduce the interference from noise signals coupling to sense plate 151 from surrounding pads 115 and components of circuit assembly 120

In many embodiments, using a sensor plate that is smaller than the width of the connector may yield less measured pin signal than a large horizontal sensor plate that covers or extends slightly beyond the connector dimensions, but the overall ratio of good pin to open pin reading will improve because the sensor plate will not receive as much signal from the board and associated features that connect to the test path. Thus, while less signal is coupled to the measurement circuitry, the ability to differentiate between connected pin and open pin nonetheless is substantially improved.

Probe assembly 350 may be configured to isolate sense plate 151 in any suitable way that leads to an improved detection of an open pin. In the embodiment illustrated in FIGS. 3A-3C, sense plate 151 is surrounded by an isolation ring 167. Isolation ring 167 may be configured in any suitable way to reduce the noise signal coupling to sense plate 151. In FIG. 3A, isolation ring 167 is a ground plate. Isolation ring 167 may be made of any suitable conductive material, such as copper, gold, or other metals, alloys, or suitably conductive materials. A configuration as illustrated may be formed using known printed circuit board fabrication techniques in which a conductive layer on a dielectric substrate is patterned. The patterning may result in separated conductive layers serving as the sensing member and guard portion, as indicated.

Sense plate 151 and isolation ring 167 may be separated by a gap 168. Gap 168 may be of any suitable size and filled with any suitable insulating substance, including air, configured to isolate sense plate 151 and isolation ring 167. In some embodiments, gap 168 may be created by etching around the perimeter of sense plate 151, leaving a gap between sense plate 151 and isolation ring 167 filled with air. In the embodiment illustrated, the width of gap 168 may be on the order of 0.1-0.5 mm. However, a gap of any suitable dimension may be used.

The isolation ring may be coupled by wires or other suitable conductors to a test system, such as test system 160 (FIG. 1A) where it is coupled to ground, or other suitable reference potential. As with other probe configurations, sense plate 151 may likewise be coupled to the test system. The coupling of the sense plate may be through one or more amplification and/or buffering circuits to measurement circuitry within the test system that can convert a measured signal into a digital value or other suitable form for processing. That circuitry is shown, in the embodiment of FIG. 3A, in a conductive cage 154a, that shields the circuitry from radiation that could create noise in measurements.

Probe assembly 350 may be further configured to isolate sense plate 151 from noise signals using a guard plate 153 as described above in FIG. 2A. In the embodiment illustrated in FIG. 3A, isolation ring 167 and sense plate 151 are located on a same surface facing the pins 116, when a circuit assembly is mounted in the fixture, or facing the fixture that would hold the circuit assembly, when no circuit assembly is placed in the fixture. A direction toward a component or toward the fixture may be regarded as a "downward" direction, such that the sensing member of the probe assembly may be said to be facing downward. However, it should be appreciated that a fixture may be mounted with any suitable orientation relative to the direction of gravity, such that "up" and "down" may be regarded as relative, rather than absolute terms. Similarly, horizontal or lateral and vertical may similarly be defined relative to a surface of a printed circuit board or fixture for a printed circuit board.

In the embodiment shown, guard plate 153 is mounted on top of sense plate 151 and isolation ring 167 and is separated from those components by a dielectric member 152. The guard plate 153 may be sized to isolate sense plate 151 from noise signals. In the embodiment illustrated, guard plate 153 spans the width of the probe assembly 350 to cover both the sense plate 151 and the isolation ring 167. In other embodiments, guard plate 153 may be sized to only cover the area above the sense plate 151.

The probe assembly 350 as illustrated in FIG. 3A may result in an increased signal to noise ratio due to the lateral separation of sense plate 151 from pads 115 and other conductors on circuit assembly 120 that may be arranged around the periphery of component 110. FIG. 3B and FIG. 3C further illustrate probe assembly 350. FIG. 3B shows a bottom view of probe assembly 350. As discussed above, sense plate 151 may be configured to mainly couple to test signals from pins 116 of component 110, which may be achieved by restricting the active area of the sensing probe. In FIG. 3B, sense plate 151 is an active area restricted to a center portion of the probe assembly 350 and having a width $W_p$ narrower than a width $W_c$ of component 110 (as shown in FIG. 3A). Width $W_p$ may be narrow enough such that sense plate 151 is aligned with the conductors of the pins within component 110, and separated from the pads on the circuit assembly to which those conductors are attached. To further reduce noise coupling to the active area, isolation ring 167 is provided around sense plate 151, separated by a gap 168 and grounded.

FIG. 3C shows a top view of sense plate 151 superimposed onto component 110. The outer edge of the isolation ring 167 is shown as a dotted line around component 110. FIG. 3C further illustrates how the geometry of a sensing member can be restricted to yield a low capacitance probe that may enhance the signal to noise ratio of a test measurement and improve the reliability of an indication of an open pin. As discussed above, sense plate 151 has a width $W_p$ narrower than a width $W_c$ of component 110 (as shown in FIG. 3A). By way of example and not limitation, width $W_p$ is comparable to the width of the compliant end portions of pins 116 as shown in FIG. 3C such that the sensing member does not overlap with the pads to which those pins are intended to be attached. In other embodiments, width $W_p$ may be much smaller than the compliant end portions of pins 116, which may occur if the sensing member is a wire centered between the rows of pins 116.

Figure 3D:
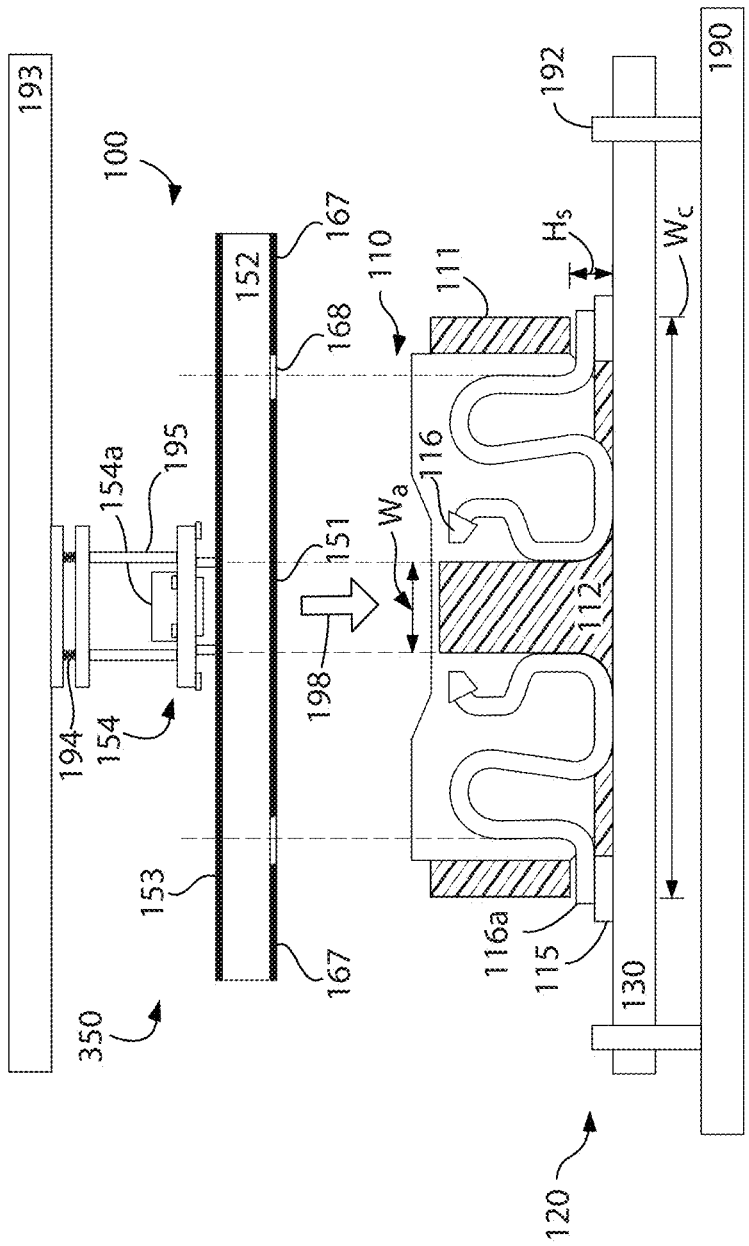
FIG. 3D is a cross-sectional view of a portion of a test setup according to an alternative embodiment.

FIG. 3C shows one example of a sense plate 151 with a width $W_p$. In other embodiments, $W_p$ may be as wide but not wider than the spacing between two opposite facing pads 115 on component 110. FIG. 3D illustrates such an embodiment. Restricting the width $W_p$ of sense plate 151 to just less than the spacing between two opposite facing pads 115 may provide a relatively large capacitance of sense plate 151 so as to increase the amount of coupling from test signals from pins 116. However, the active area may be narrow enough to avoid any significant coupling from noise signals from pads 115 and other circuit components on circuit assembly 120. In FIG. 3D, the spacing between opposite facing pads 115 is marked by two dotted lines.

In some embodiments, the component under test may be small enough that a guide for the probe assembly may be used to ensure the desired positioning of the sensing member of the probe assembly. Such positioning may laterally align the sensing member of the probe assembly with the conductors of the pins while separating the sensing member from pads or other conductors at the periphery of the component under test. A guide may also provide appropriate vertical positioning to avoid contact between the sensing member of the probe assembly and the conductors of the component under test.

Figure 2C:
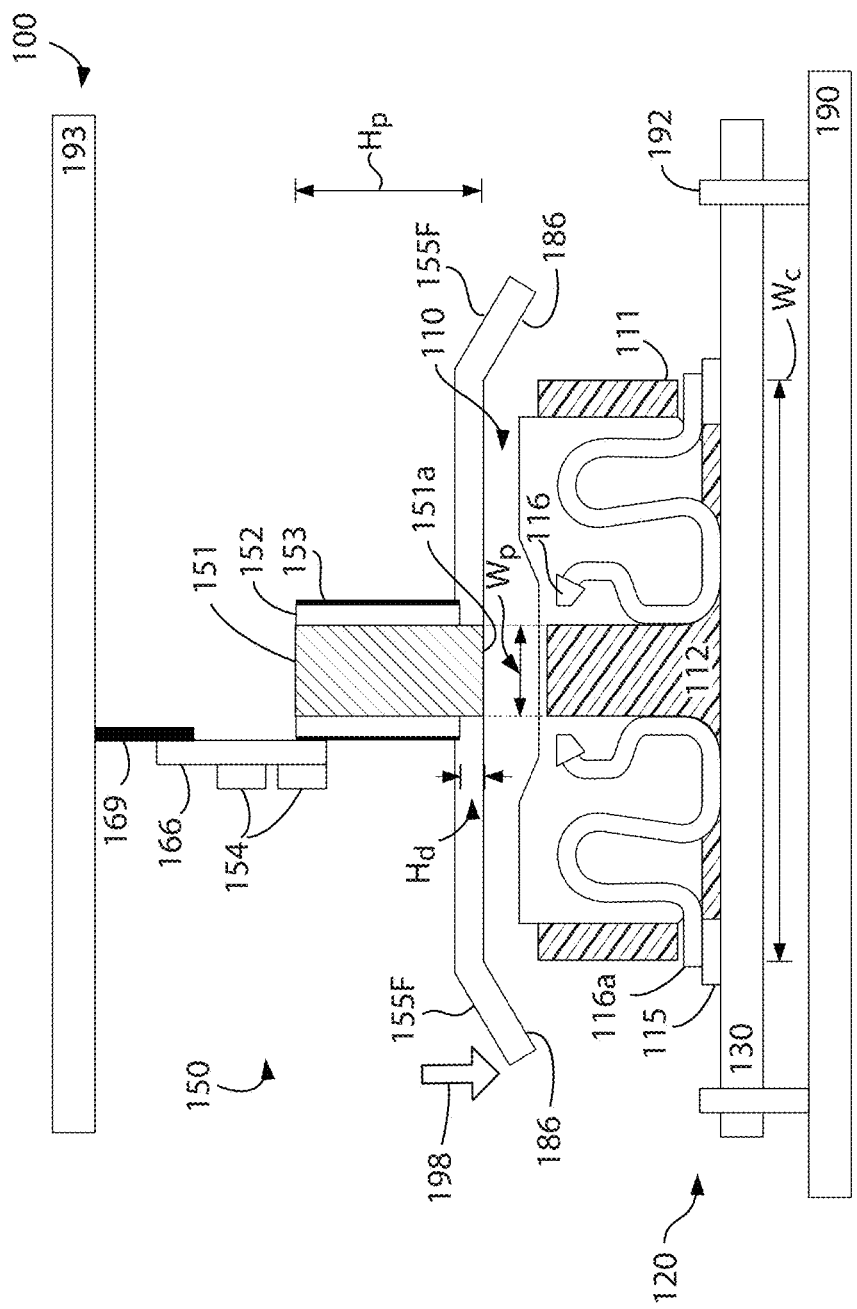
FIG. 2C is a cross-sectional view of a portion of a test setup according to a third embodiment having a probe with a guide portion adapted to self-align the probe up with a component of a circuit assembly.
Figure 3E:
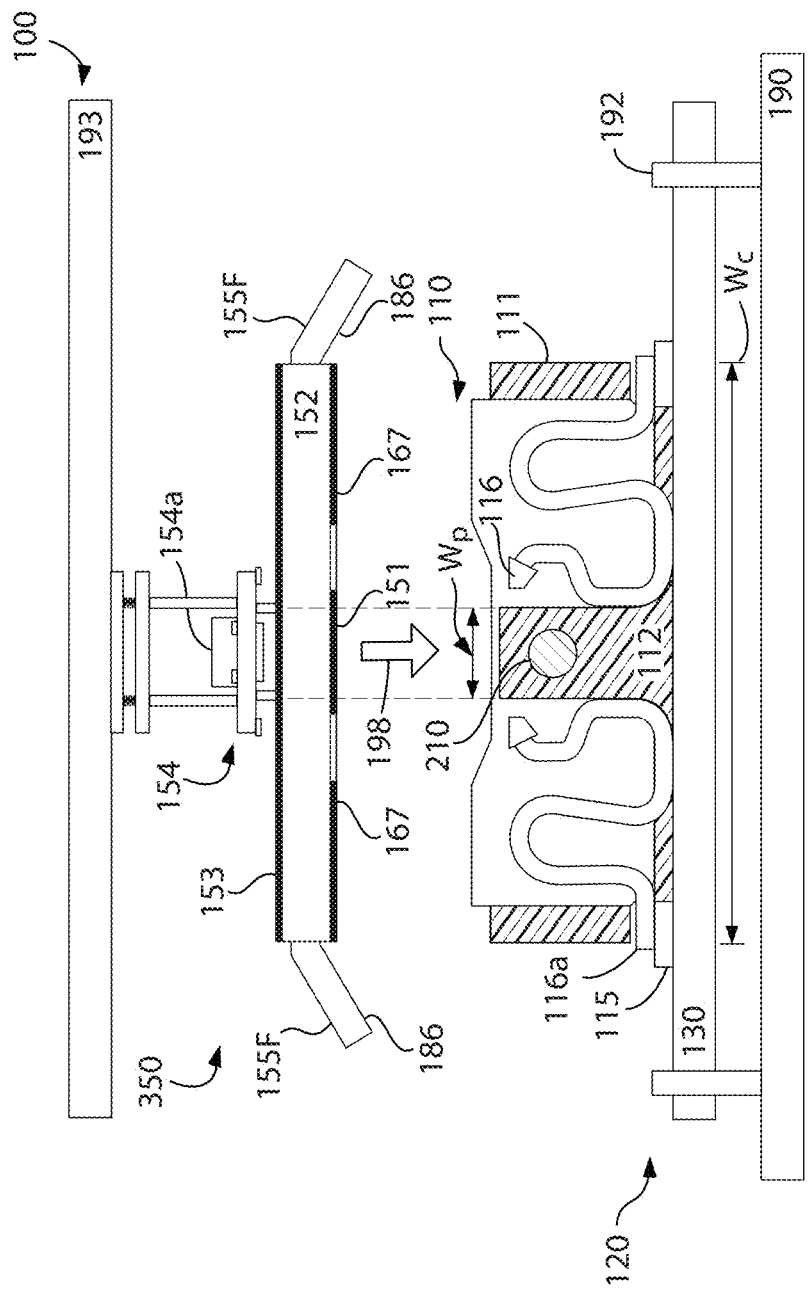
FIG. 3E is a cross-sectional view of a portion of a test setup according to some embodiments having a probe assembly with a guide portion adapted to self-align the probe up with a component of a circuit assembly and a probe with a central sensing member.

FIGS. 2C and 3E provide examples of a spacer including guiding features that may be used to position a probe assembly. Guiding features may have appropriately shaped surfaces that contact the component 110 (and/or circuit assembly 120) when fixture over-clamp 193 is lowered to the test position. These surfaces may be beveled and/or tapered to guide the probe assembly to the desired measurement position. Though, surfaces of any suitable shape and position may be used.

Those of skill in the art will appreciate that probe assemblies 150 and 350 and component 110 may be vertically and laterally aligned for test measurements using guiding features of any suitable configuration. FIGS. 2C and 3E illustrated two embodiments of test setup 100 with beveled guides to facilitate alignment. The guides may fit over the component under test and the beveled guides may urge the probe assembly into alignment with the component under test.

The guiding portions may have any suitable shape. For example, alternatively or additionally, beveled guides may be integrated into the component 110 or alternatively or additionally into a surface of a circuit assembly. Moreover, it is not a requirement that the guiding features have beveled surfaces. Guiding features may be implemented using curved surfaces, conical surfaces, or surfaces of any other suitable shape.

FIG. 2C and 3E illustrate in cross-section embodiments where probe assemblies 150 and 350, respectively, include wing spacers 155F which are beveled "wings" for aligning the probe with a component 110. Spacers 155F may, in some embodiments, also hold the probe assembly with sufficient separation from the component that the sensing member of the probe assembly does not contact conductors of the component. Wing spacers 155F may extend beyond the sides of the component 110 such that each of the beveled wings, as the probe assembly moves towards a component under test, will contact a portion of the component, even if the probe assembly is not vertically aligned with the component. As the probe assembly moves closer to the component, the beveled surfaces 186 of wing spacers 155F will slide along the sides of component 110, generating a vertical force that moves the probe assembly into proper alignment for a sensing member on the probe assembly to be positioned adjacent the conductors of the component. In this embodiment, the beveled wings may also act as spacers, preventing the sensing member from contacting pins within the component once the probe assembly is properly positioned adjacent to the component. In some embodiments, the probe assembly may be partially inserted into a cavity of the component, in which case, the beveled wings ensure that the sense plate appropriately enters the cavity.

Use of guiding features and/or spacers for achieving lateral and/or vertical positioning of a probe assembly in close proximity to pins of a component may increase the strength of a signal coupled to a sensing member of the probe assembly. Consequently, more accurate testing may be performed. Another approach to improving testing accuracy is to provide a low-capacitance probe. These techniques may be used alone or in combination.

FIG. 4A illustrates a cross section of a portion of a probe assembly 350 according to the embodiment described in FIG. 3A. As illustrated, probe assembly 350 may further include a probe amplifier 154 electrically connected to sense plate 151. Probe amplifier 154 may be of any suitable design configured to amplify the response signal voltage detected on sense plate 151. In some embodiments, probe amplifier 154 is a differential amplifier with a first terminal electrically connected by a first electrical lead to guard plate 153 and with a second terminal electrically connected by a second electrical lead to sense plate 151. For example, probe amplifier 154 may be an operational amplifier. Though any suitable amplifier may be used. In some embodiments, probe amplifier 154 may be augmented with a filter or designed to filter the response signal. The filter characteristics may be determined, for example, in accordance with the tests being performed or test signals being used. The portion of the probe assembly shown in FIG. 4A is intended to be a representation of one example of the probe assembly and is not limited to the embodiment shown in FIG. 3A. A low capacitance probe as illustrated in connection with FIGS. 4A and 4B could have been used in other embodiments described herein, including FIG. 2A-2C and 3B-3E. For example, any embodiment may contain a guard plate as shown in FIG. 4B.

Sense plate 151 and guard plate 153 are capacitively coupled to each other through dielectric 152. The amplitude of the signal coupled to sense plate 151 from a pin under test may depend on the capacitance between sense plate 151 and guard plate 153. In some embodiments, it may be desirable to reduce the capacitance between sense plate 151 and guard plate 153 to provide a low capacitance probe.

A low capacitance probe may be provided in any suitable way. According to some embodiments, a low capacitance between the sensing member and guard plates is achieved by reducing a total surface area of guard plate 153 by introducing holes in its surface. When compared to a conventional probe performing the same test, the voltage on sense plate 151 of the low capacitance probe is larger before amplification by probe amplifier 154. Accordingly, the response signal measured on a low capacitance probe may have a superior signal to noise ratio, leading to more accurate testing. The probe capacitance may also be reduced by increasing the thickness of dielectric 152 and/or using a low-K dielectric material.

FIG. 4B shows a top view of guard plate 153. Sense plate 151 as shown in FIG. 3B and guard plate 153 may have any suitable shape, but in the embodiments illustrated are substantially planar structures. According to some embodiments, guard plate 153 has a plurality of holes 157 reducing the overall surface area of guard plate 153 (FIG. 4B). Holes 157 may be formed in guard plate 153 in any suitable way and may be sized and positioned to reduce the capacitance between sense plate 151 and guard plate 153. In the example illustrated, circular holes are formed using known printed circuit board manufacturing techniques to remove conductive material from guard plate 153.

It should be appreciated that the holes need not be filled with air. Any suitable approach that reduces the amount of conductive material at the surface of the guard plate 153 facing sense plate 151 may be used to form the holes. For example, the holes may be formed by removing material, embossing the plate to move conductive material away from the surface, reducing the thickness of conductive material, or reducing the conductance of conductive material. Any of these techniques to create holes may be achieved by removing or changing material once in the form of a plate or by depositing or otherwise selectively depositing or otherwise positioning material over only selected portions of a region.

In some embodiments, guard plate 153 is separated from sense plate 151 by a distance, d, and each of holes 157 has a diameter greater than d. For example, the holes may be circles with a diameter that is at least equal to the dielectric thickness 184. In some embodiments, the diameter may be 3 to 4 times the thickness. In yet some other embodiments, the diameter may be about 10 times the thickness. Though, the holes may have other shapes than circles. In some embodiments, whether or not the holes are circular, each hole 157 occupies an area of at least $\pi(n\,d/2)^2$, where n may be, for example, 1, 3, 4, or 10. For example, in one embodiment dielectric 152 has a thickness of about 50 mils and guard plate 153 has a plurality of circular holes each having a diameter of about 100 mils. In some embodiments, dielectric 152 has a thickness between 25 mils and 150 mils and the guard plate has holes each with a surface area in the range of 0.00049 to 0.0177 square inches ($in^2$).

While sense plate 151 and guard plate 153 are shown having a rectangular shape, it should be appreciated that they may take any suitable shape. In some embodiments, the plates are shaped to conform to a particular component to be tested and/or a central portion of such component that contains conductors for connection to a printed circuit board, but is laterally separated from the pads to which those conductors are attached.

It should be appreciated that while circular holes were shown for guard plate 153 in examples illustrated, the holes may take any shape and size. For example, the holes could be triangles, squares, diamonds, ovals, or any other shape or combination of shapes. The holes may be arranged in a hatched pattern. In some embodiments, holes 157 each have substantially the same size and shape. Though, in other embodiments, holes 157 need not be of the same size or shape. For example, holes may each have an irregular shape and have irregular spacing. Holes 157 may account for any suitable amount of the surface area of guard plate 153, as defined by the perimeter of the plate to reduce the capacitance as compared to a probe without holes 157 to a desired level. For example, sense plate 151 and guard plate 153 may each have an area defined by their respective perimeters. In some embodiments, the areas may be at least or at most 0.15, 0.5, 0.75, 1.0 or 3 in2. In some embodiments, the holes may account for at least or at most 10 percent of the total area. Though, in other embodiments, the holes may account for a larger percentage of the total area, such as at least 25, 40 or 50 percent of the total area. In some embodiments, the capacitance between sense plate 151 and guard plate 153 is less than 100 picofarads (pF). In some embodiments, the capacitance is less than 35 pF. In some embodiments, the capacitance is in the range of 10 to 20 pF.

Having discussed some embodiments of test setup 100, methods of using test setup 100 are briefly discussed with reference to FIGS. 5-6.

Figure 5:
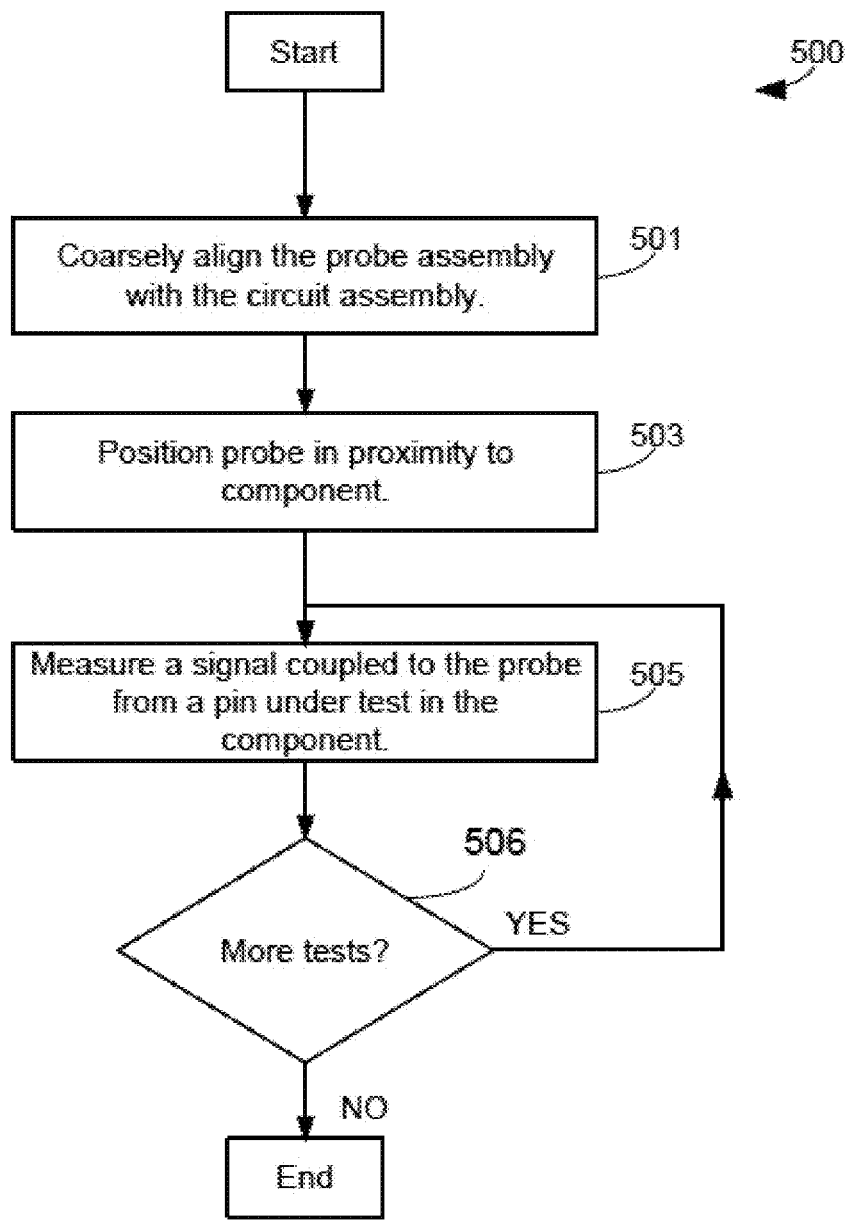
FIG. 5 is a flow diagram illustrating a method for testing a circuit assembly according to some embodiments.

FIG. 5 is a flow chart of a method 500 of testing pins of a component using a test probe as described herein.

At step 501, the probe assembly is coarsely aligned with the circuit assembly. The course alignment should be sufficient to ensure the alignment features between the probe assembly and circuit assembly are engaged when brought into contact with one another. Coarsely aligning the probe and circuit assembly may be performed, for example, placing the circuit assembly in a test fixture to which the probe is attached.

At step 502, the probe assembly and a component on the circuit assembly are moved together while allowing compliant motion based on alignment features of the probe and/or circuit assembly. In some embodiments, the probe and circuit assembly are brought into contact and the alignment features provide lateral alignment of the probe with pins in the component of the circuit assembly.

At step 503, the probe assembly is positioned in proximity to the component. The probe assembly may be lowered toward the component. Sense plate 151 and pins 116 may be separated by a gap of a predetermined distance h. In some embodiments, distance h of the gap in some embodiments may be less than 20 mils (1 mil=1/1000 inch=0.0254 mm). In other embodiments, distance h of the gap may be less than 40 mils. In some other embodiments, distance h of the gap may be between 10 mils and 20 mils. In yet some other embodiments, distance h is between 10 mils and 100 mils.

At step 505, a signal coupled to the sense plate of the probe assembly is measured. The signal may be coupled in response to excitation of one or more pins under test in the component. The pins under test may be excited in any suitable way, such as by injection of a test signal onto traces of a printed circuit board to which a component under test is to be attached. For example, the pin under test may be excited in accordance with capacitive opens testing techniques. In some embodiments, the response signal is suitably amplified and filtered by the probe assembly.

Optionally, the measured signal may be analyzed to determine, for example, if a pin under test is properly connected to the circuit assembly. For example, the magnitude of the measured signal may be compared to a threshold determined in a learn phase of testing. The result of comparing the magnitude with the threshold may be indicated through any suitable output device.

At step 506, a determination is made of whether there are any more tests to perform. For example, further tests may be performed to test other pins in the component. If another test is to be performed, method 500 returns to step 505 to conduct the subsequent test. If testing is complete, method 500 ends.

Figure 6:
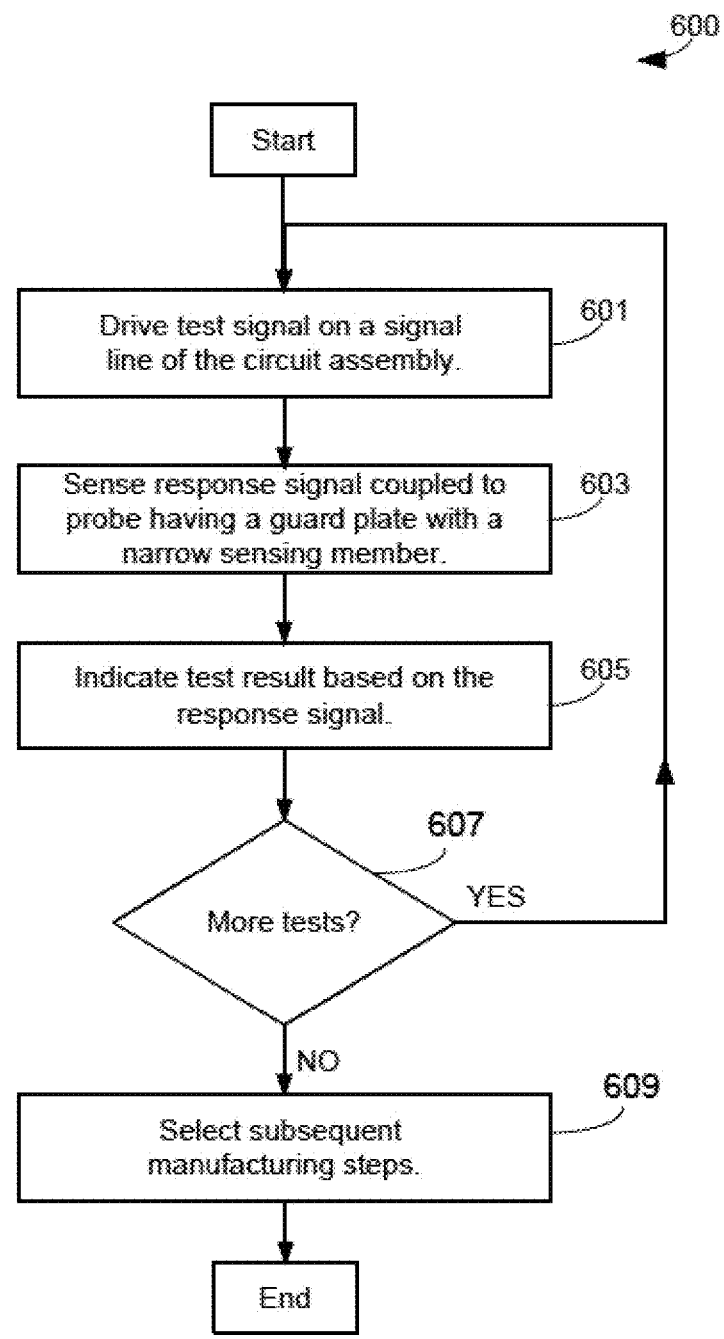
FIG. 6 is a flow diagram illustrating a method of manufacturing a circuit assembly according to some embodiments.

FIG. 6 shows a flow chart of a method 600 for manufacturing a circuit assembly including capacitively testing the circuit assembly using a probe assembly.

At step 601, a test signal is driven on a signal line of the circuit assembly. The test signal may be supplied by a test system or by a virtual circuit generator. Any suitable electrical signal may be used as a test signal.

At step 603, a response signal coupled to a low capacitance probe having a guard plate with a plurality of holes is sensed. For example, the response signal may be coupled to a sense plate of the probe, amplified and digitized by a test system for analysis. The holes on the low capacitance probe's guard plate may take any suitable form. In some embodiments, the holes account for at least 25% of the total surface area of the guard plate as defined by the area within the perimeter of the guard plate. In some other embodiments, the holes account for at least 50% of the surface area. In some other embodiments, the total area of the holes is at least 40% of the surface area of the sense plate as defined by the area within the perimeter of the sense plate. In yet some other embodiments, the total area of the holes is at least 50% of the surface area of the sense plate as defined by the area within the perimeter of the sense plate. Though, the holes may account for any suitable amount of guard plate surface area reduction.

At step 605, a test result is indicated based at least in part on the response signal measured at step 603.

At step 607, a determination is made as to whether there are any more tests to conduct. If the determination is yes, method 600 continues to step 601. If the determination is no, method 600 continues to step 609.

At step 609, subsequent steps in the manufacturing process are selected. The selection of the subsequent steps may be based, for example on the one or more test results indicated at step 605.

Methods 500 and 600 may each be used as an intermediary step in a manufacturing process for circuit assemblies. The measurement and/or test results collected as a result of performing method 500 and 600 may be used for each circuit assembly to determine which subsequent steps in the manufacturing process are to be performed for that circuit assembly. For example, if all tests performed on the component yielded a positive result a determination may be made that the component has been properly installed on the circuit assembly. If some tests have failed, a decision may be made to conduct subsequent tests, to replace the component, or take another suitable action. In some embodiments, method 500 is performed using a low capacitance probe assembly.

Having thus described at least one illustrative embodiment of the invention, various alterations, modifications, and improvements will readily occur to those skilled in the art.

For example, embodiments described above involve a conductive sense member moved to be near conductors within a component. In other embodiments, a conductive sensor object may already built into the component under test. When a circuit assembly is placed in a fixture, a probe may make a physical connection to the sensor object. The sensor object may be held within a connector housing, for example, such that a desired spacing between the sensing member and conductors may be fixed upon manufacture of the component.

FIG. 3A illustrates such an approach to positioning a sensing member by showing a sensor object 210 within a connector. Here, sensor object 210 is shown in the center of the connector. The sensor object is shown in cross section and may be a conductive wire or other structure that positions it near conductors. The sense object may also be shaped and connected to other components to allow a test system to make access to it for testing the component. For example, the sensor object may be electrically connected to two metal end features that are commonly used to mechanically secure a connector to the PCB. Test probes might make contact to these metal end features, if exposed. Alternatively, test probes might make contact to some conductive structure to which these features are electrically connected. For example, a small, short trace might connect the end metal fasteners to test pads. An amplifier, such as amplifier 154, or any other suitable location may have a probe on the end that contacts the test pad. Alternatively, either or both of the end caps could be probed directly to make an electrical connection to the embedded sensor plate inside of the connector.

Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A method of testing a circuit assembly comprising a substrate and a component mounted to the substrate, the component comprising a two-dimensional array of a plurality of conductors, the two-dimensional array having a first area, the method comprising acts of:
   in production,
      positioning a probe adjacent to the component, wherein the probe comprises a conductive sensing member having a second area that is smaller than the first area of the two-dimensional array of the plurality of conductors and having a length such that the conductive sensing member is positioned to capacitively couple to two or more of the plurality of conductors;
      coupling a test signal to the substrate; and
      sensing the signal capacitively coupled to the sensing member from a conductor of the plurality of conductors.

2. The method of claim 1, wherein:
the plurality of conductors are configured within a housing to provide a dual in-line component, with each of two lines of conductors being perpendicular to a width of the sensing member.

3. The method of claim 2, wherein:
positioning the probe comprises positioning the sensing member parallel to and between the two lines of conductors.

4. The method of claim 1, wherein:
the component has a standoff from the substrate of less than 2 mm.

5. The method of claim 1, wherein:
a plurality of pads are positioned on the substrate at a periphery of the component; and
positioning the probe comprises positioning the sensing member at a central location of the component.

6. The method of claim 1, wherein:
the sensing member comprises a planar conductive member with a width less than 2 mm.

7. The method of claim 6, wherein the planar conductive member is oriented horizontally with respect to the substrate.

8. The method of claim 6, wherein the planar conductive member is oriented vertically with respect to the substrate.

9. The method of claim 1, wherein:
the component comprises a housing with a cavity in which portions of conductors of the plurality of conductors are exposed;
the sensing member comprises a plate comprising an edge; and
positioning the probe adjacent to the component comprises positioning the edge in the cavity.

10. The method of claim 1, wherein:
the sensing member comprises a wire.

11. The method of claim 1, wherein:
the sensing member is embedded within the component; and
sensing the signal capacitively coupled to the sensing member further comprises making an electrical connection to the sensing member.

12. A probe assembly for making capacitive measurements of signals coupled from a conductor of a two-dimensional array of a plurality of conductors of a component, the two-dimensional array having a first area, the component being attached to a printed circuit board, the probe assembly having a component-facing portion, and the probe assembly comprising:
   a support member;
   a planar, conductive sensing member mechanically coupled to the support member, the sensing member comprising a portion defining the component-facing portion of the probe assembly, the component-facing portion having a second area that is less than the first area of the two-dimensional array of the plurality of conductors;
   circuitry, electrically coupled to a sensor plate, the circuitry being configured to amplify a signal capacitively coupled from a conductor of the plurality of conductors to the sensor plate; and
   a guide portion configured to guide the sensing member into alignment with the plurality of conductors of the electronic component.

13. The probe assembly of claim 12, wherein:
the sensing member comprises a planar surface and an edge; and
the sensing member is attached to the support member such that the edge defines the component-facing portion of the probe assembly.

14. The probe assembly of claim 13, wherein:
the support member comprises a planar dielectric portion; and
the sensing member is attached to the support member such that the surface of the sensing member is parallel to and extending from the planar dielectric portion of the support member.

15. The probe assembly of claim 14, wherein:
the surface of the sensing member comprises a first surface;
the sensing member comprises a second opposing surface; and
the probe assembly further comprises:
   a first guard plate parallel to the first surface; and
   a second guard plate parallel to the second surface.

16. The probe assembly of claim 12, wherein:
the sensing member comprises a surface and an edge; and
the sensing member is attached to the support member such that the surface defines the component-facing portion of the probe assembly.

17. The probe assembly of claim 16, wherein:
the support member comprises a planar dielectric portion; and
the sensing member is attached to the planar dielectric portion of the support member, with the surface parallel to the planar dielectric portion.

18. The probe assembly of claim 17, further comprising:
a guard portion attached to the planar dielectric portion of the support member, the guard portion surrounding the sensing member.

19. The probe assembly of claim 12, wherein:
the component is a dual-inline microconnector, and the guide portion is sized to engage the dual-inline microconnector.

20. A probe assembly for making capacitive measurements of signals coupled from a conductor of a two-dimensional array of a plurality of conductors of a component, the two-dimensional array having a first area, the component being attached to a printed circuit board, the probe assembly having a component-facing portion, and the probe assembly comprising:
a support member;
a planar, conductive sensing member mechanically coupled to the support member, the sensing member comprising a portion defining the component-facing portion of the probe assembly, the component-facing portion having a second area that is less than the first area of the two-dimensional array of the plurality of conductors; and
circuitry, electrically coupled to a sensor plate, the circuitry being configured to amplify a signal capacitively coupled from a conductor of the plurality of conductors to the sensor plate, wherein:
the sensing member comprises a planar surface and an edge,
the sensing member is attached to the support member such that the edge defines the component-facing portion of the probe assembly,
the support member comprises a planar dielectric portion,
the sensing member is attached to the support member such that the surface of the sensing member is parallel to and extending from the planar dielectric portion of the support member,
the surface of the sensing member comprises a first surface,
the sensing member comprises a second opposing surface, and
the probe assembly further comprises:
a first guard plate parallel to the first surface; and
a second guard plate parallel to the second surface.

* * * * *